April 14, 1970 M. OWEN 3,506,877

HERMETICALLY SEALED AND SHIELDED CIRCUIT MODULE

Filed Sept. 25, 1968

INVENTOR
MICKEY OWEN

BY H. H. Losche

ATTORNEY

United States Patent Office 3,506,877
Patented Apr. 14, 1970

3,506,877
HERMETICALLY SEALED AND SHIELDED CIRCUIT MODULE

Mickey Owen, St. Louis, Mo., assignor to the United States of America as represented by the Secretary of the Navy Filed Sept. 25, 1968, Ser. No. 762,462
Int. Cl. H02b *1/00*
U.S. Cl. 317—100 7 Claims

ABSTRACT OF THE DISCLOSURE

A hermetically sealed and shielded circuit module and method of making same having an elongated connector header with a connector indexing means and two rows of connector pins glass sealed therethrough and an upstanding heat sink shield with a printed circuit board affixed to each side and circuit coupled to the connector pins, and a cover with one atmosphere of helium gas therein hermetically sealing the printed circuits within the confines of the cover and connector header in contact arrangement to conduct internally generated heat to the exterior through the cover and to shield the circuits from internal and external radio frequency interference.

BACKGROUND OF THE INVENTION

This invention relates to hermetically sealed printed circuit modules and more particularly to a printed circuit module that is easy to assemble and to disassemble for repairs yet can be hermetically sealed and resealed with effective metal to metal contact of internal heat sink parts with the cover to rapidly dissipate heat and to shield the circuit from radio frequency interference (RFI).

In prior known circuit modules the methods used to protect moisture-sensitive circuits and components generally consist of packaging concepts that utilize metalized or glass-fired hermetic seals on ceramic package bases, glass-fired films over individual circuits or component junctions, or solder or weld-sealed metal containers with feed-throughs and encapsulants over the circuits. The metalized film and sealed metal container concepts normally come in an infinite number of sizes and interconnection arrangements, waste space internally with additional jumper wire interconnections between the bulky feed-through and circuit lands, exhibit poor heat transfer and shielding characteristics, require complicated fabrication techniques, and are very hard to repair or they are not repairable at all. The encapsulated modules do not provide true hermetic protection for the circuits, since they only retard the circuit and component deterioration because moisture penetration cannot be completely stopped by an encapsulant. Also, most encapsulants have poor heat transfer characteristics and they induce stresses on the circuits and components during thermal changes or vibration. Shielding is normally provided between circuits by magnetic metal plates that require additional space, add weight, and require special grounding or interconnection considerations that complicate the module package.

SUMMARY OF THE INVENTION

In this invention a module of a base and a cover is pressed out of Kovar or Rodar, or any similar metal as long as it has a coefficient of thermal expansion close to that of glass. The base has two parallel rows of holes through which connector pins are sealed in by glass. A heat sink division wall is soldered or otherwise fixed to this base or connector header in an upright position between the two rows of connector pins. Two printed circuit boards are affixed to the two sides of the heat sink division wall with connector lands thereon soldered to the connector pins to establish the desired circuits. The cover is soldered to the connector header in an atmosphere of helium gas sealing in the printed circuits. Shielding pads may be used in the connection of the periphery of the heat sink and the cover to provide good heat transfer and to provide RFI shielding. It is accordingly a general object of this invention to provide a hermetically sealed and RFI shielded printed circuit module that is moisture proof and readily repairable by easy disassembly of the cover and printed circuit boards.

BRIEF DESCRIPTION OF THE DRAWING

These and other objects and the attendant advantages, features, and uses of this invention will become more apparent to those skilled in the art as a more detailed description proceeds when taken with the accompanying drawing, in which.

DESCRIPTION OF THE PREFERRED EMBODIMENT

Figures 1, 2:
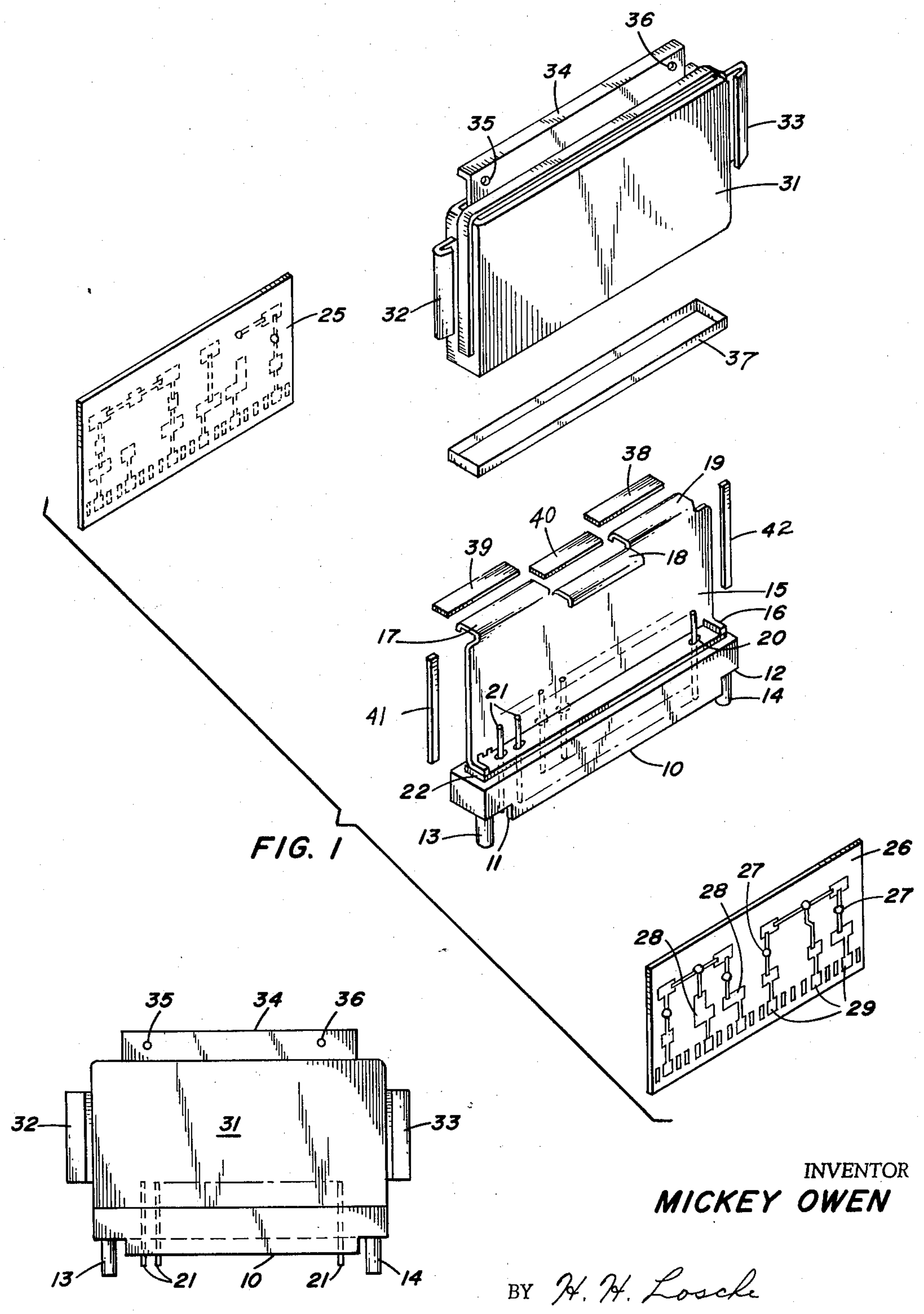
FIGURE 1 is an exploded view of the circuit module of this invention.
FIGURE 2 is a side elevational view of the circuit module in its assembled form.

Referring more particularly to FIGURE 1 the module is constructed upon a base or connector header 10 made by press forming a metal material or by construction from a metal bar, such as from the metal Kovar, Rodar, or any similar material that has a coefficient of thermal expansion close to that of glass. The base or connector header 10 has cut out portions 11 and 12 on opposite ends and has drilled openings for receiving indexing pins 13 and 14 in the area of these cut out portions. The indexing pins 13 and 14 and the cut out portions 11 and 12 made to interfit with a standard companion connector to which the module will be connected as one of a bank of circuit modules. Upstanding from the top face of the connector header 10 is a heat sink mounting shield 15 having a base portion 16 bent as a flange to fit on the top portion of the connector header 10 to be secured thereto as by soldering, welding, or the like. The heat sink shield 15 has flanges 17, 18, and 19 on the top portion thereof, the flange 18 being extended in an opposite direction from flanges 17 and 19 for the purpose hereinafter to be explained. The heat sink shield 15 extends upwardly from the center of the connector header 10, and the connector header 10 and the flange 16 of the heat sink shield 15 are drilled in providing a row of holes 20 on opposite sides of the shield 15. In each of the holes 20 is a feed-through pin 21 that is electrically insulated from the metal of the connector header 10 and the heat shield 15 by a glass-to-metal seal. It is because of these glass-to-metal seals for these connector pins 21 that the connector header 10 and the heat sink shield 15 are of Kovar or Rodar or materials of similar coefficient of expansion to enable an effective glass-to-metal seal to be made. The connector pins 21 extend just a short distance above the flange 16 and extend below the cut out portions 11 and 12 of the connector header to provide an effective connection to the companion connection block to which the module is frictionally held. The flange portion 16 of the heat sink shield provides a peripheral edge over the top face of the connector header 10 for providing a solder seal with a cover, as will later be more fully described.

Two printed circuit boards 25 and 26 having circuit component 27, circuit connector lands 28, and terminal connector lands 29 mounted thereon. These circuits may be vacuum deposited, screened and fired, or etched on the board which may be of ceramic glass or glass filled epoxy material of any commonly known type used in the industry. The circuit components, terminal lands, and connector lands are shown on the circuit board 25 in dotted lines since these circuit elements and components are affixed on the side of the board away from the viewer in this figure. The circuit board 25 is bonded to the heat sink shield 15 on the side away from the viewer in FIGURE 1 and the circuit board 26 is bonded to the front face of the heat sink shield 15, as seen in FIGURE 1. The connector pins 21 are soldered or welded or otherwise affixed to the terminal lands 29 of the two circuit boards to provide circuits through these connector pins to the exterior. One of the connector pins 21 may be soldered, welded, or otherwise affixed to the heat sink shield 15 as a ground pole. The bonding material used to bond the circuit boards to the shield 15 should be an adhesive that has very good heat transfer characteristics. The module is constructed thus far in this description provides a complete printed circuit module component as far as the circuit continuity is concerned although it is unshielded without a cover.

A metal cover 31 of Rodar, Kovar, or other suitable material, is fabricated from a sheet material in one or more parts by pressure, such as by a hydroform or hydraulic press, to exactly interfit over the heat sink shield 15 with the lower periphery opening exactly fitting over the periphery 22 of the flange portion 16 of the heat shield 15. The cover 31 has module guides 32 and 33 affixed to opposite ends thereof as by soldering or welding which guides are used to interface with the module retaining companion connector. The cover 31 also has a fin 34 soldered, welded, or otherwise affixed to the upper portion of the cover which fin has openings 35 and 36 to facilitate pulling the module from the companion connector retaining device. The guides 32 and 33 and the fin 34 may be made separately and affixed to the cover 31, as hereinabove stated, or these parts may be pressed from a single sheet from the cover is made. The cover 31 with its guides 32 and 33 and its fin 34 may be plated to protect the base material and to promote good fuzed connections. The cover 31 may then be placed over the circuit module heat sink shield 15 and fuzed to the portion 22 by the use of a pre-formed solder ring 37 to completely enclose the circuit boards 25 and 26. The flanges 17, 18, and 19 engage the roof of the cover and retain the shield 15 in a central position. The cover 31 is fuzed to the periphery 22 of the heat shield 15 in an atmosphere of dry helium at a pressure of one atmosphere to eliminate any damaging active gases and to provide good heat transfer characteristics from the circuit boards 25 and 26 generated by the circuitry to the cover 31. The heat sink shield 15 provides means of dissipating the heat from the circuits and the circuit boards to the flanges 17, 18, and 19 and thus to cover 31 for dissipation into the atmosphere as well as the heat transfer to the helium gas to the side faces of the cover 31 and thus to the atmosphere. The heat sink shield 15 also provides a shield of RFI between the circuit boards, and the cover 31 provides good shield against RFI from external source or between circuit modules in the bank in which this module is used. If a greater requirement for RFI shielding exists, shielding gasket material such as shown by the pads 38, 39, and 40, and by the end gaskets 41 and 42 may be bonded to the flanges 17, 18, and 19, respectively, and to the end portions of the heat sink shield 15, as shown in their approximate positions in the exploded view of FIGURE 1.

Referring more particularly to FIGURE 2 a side elevational view of the assembled circuit module is shown with like reference characters applied to the like parts of FIGURE 1. Since the cover 31 is affixed to the connector header 10 by the solder ring 37 bonding the peripheral portion 22 of the heat sink shield 15 and the lower periphery of the cover, this cover is readily removable by reheating this solder ring to regain entrance to the circuit boards in the module. In this manner circuit elements and components on the circuit boards may be repaired or replaced and the cover reaffixed in an atmosphere of dry helium as before to place the circuit module back in service.

The hermetically sealed circuit module is unique in that it provides a good hermetic seal against moisture protecting the internal circuitry and good RFI shielding for the circuits in one small package. Internal shielding is provided between the two circuit boards 25 and 26 by the heat sink shield 15 separating them and external shielding is provided by the hermetically sealed cover 31. No additional space is required for the shields as in other units and special grounding is eliminated. Also, the module requires only standard fabrication techniques for making the hermetic seals. The module has excellent heat transfer and shielding characteristics since the circuit boards 25 and 26 are bonded directly to the heat sink shield 15. The feed-through connector pins 21 are connected directly to the interconnection lands 29 and no space is wasted or failure points induced by additional connections between the feed-through and circuitry as usually required in other modules. The unit is easily repaired since the cover can be removed by reflowing the material forming the hermetic seal. The module of this invention has a versatility of being able to utilize most of the circuits now being used in industry while remaining within a fixed form factor. The module provides true hermetic protection and since the circuit is only surounded by an inert gas, no stresses are induced on it during thermal cycling or vibration.

While many modifications and changes may be made in the methods of construction, in the details of construction, or in the features of this invention to carry out the teaching and concept herein disclosed, it is to be understood that I desire to be limited in the scope of my invention only by the limits of the appended claims.

I claim:

1. A hermetically sealed and electrically shielded circuit module comprising:
- a connector header having a plurality of connector pins extending therethrough and electrically insulated therefrom and having an upstanding heat sink electrical shield centrally between said connector pins at the base thereof;
- a printed circuit board on each of opposite sides of said heat sink electrical shield having circuit lands connecting said connector pins; and
- a cover removably fixed by fuzible material to said connector header covering said heat sink electrical shield and printed circuit boards with the top of the heat sink electrical shield and the top of said cover being in contact to provide heat dissipation through said cover, to provide moisture protection, and to provide radio frequency interference shielding whereby a hermetically sealed circuit module is produced for plugging into a companion connector.

2. A hermetically sealed and electrically shielded circuit module as set forth in claim 1 wherein said cover contact to said heat sink electrical shield is through radio frequency interference shielding gasket material.

3. A hermetically sealed and electrically shielded circuit module as set forth in claim 2 wherein said electrical insulation between said connector header and said connector pins is glass-to-metal seal.

4. A hermetically sealed and electrically shielded circuit module as set forth in claim 3 wherein said connector header has indexing pins protruding in parallel with said connector pins to facilitate said plugging into a companion connector.

5. A method of making a hermetically sealed and electrically shielded circuit module comprising:
- forming a connector header with indexing pins on opposite ends thereof;
- drilling two rows of holes through said connector header parallel to said indexing pins and affixing connector pins through said holes with molten glass;

affixing by molten metal an upstanding heat sink electrical shield with the edge affixed to said connector header between said two rows of connector pins;

affixing by adhesive a printed circuit board to opposite sides of said heat sink electrical shield and soldering circuit connector lands thereon to said connector pins; and press forming a cover and soldering said cover to said connector header hermetically sealing in said printed circuit boards in an atmosphere of an inert gas, said heat sink electrical shield making a heat transfer connection to said cover to conduct heat generated in the circuits of said circuit boards to the exterior, and said cover providing radio frequency interference shielding and moisture proof for said circuit module.

6. A method of making a hermetically sealed and electrically shielded circuit module as set forth in claim 5 wherein said method step of soldering said cover to said connector header in an atmosphere of an inert gas is in one atmosphere of helium sealing an atmosphere of said helium within said hermetically sealed module.

7. A method of making a hermetically sealed and electrically shielded circuit module as set forth in claim 6 wherein said making of a heat transfer connection between said cover and heat sink shield is by affixing electrical shielding gasket material to said heat sink shield periphery to make contact with said cover.

References Cited

UNITED STATES PATENTS 3,243,660 3/1966 Yuska et al. -------- 317—100
3,271,638 9/1966 Murad.

LEWIS H. MYERS, Primary Examiner

D. A. TONE, Assistant Examiner

U.S. Cl. X.R.

29—625, 627; 165—185